(12) United States Patent
Li et al.

(10) Patent No.: US 8,476,163 B2
(45) Date of Patent: Jul. 2, 2013

(54) SEMICONDUCTOR DEVICE AND MANUFACTURING METHOD THEREFOR

(75) Inventors: Fan Li, Shanghai (CN); Haiyang Zhang, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 0 days.

(21) Appl. No.: 13/291,096

(22) Filed: Nov. 8, 2011

(65) Prior Publication Data
US 2012/0326328 A1    Dec. 27, 2012

(30) Foreign Application Priority Data
Jun. 27, 2011    (CN) .......................... 2011 1 0174754

(51) Int. Cl.
*H01L 21/44*    (2006.01)
*H01L 29/40*    (2006.01)
(52) U.S. Cl.
USPC .......................................... 438/667; 257/774
(58) Field of Classification Search
USPC .................. 438/666–668, 672, 675; 257/621, 257/774
See application file for complete search history.

(56) References Cited

U.S. PATENT DOCUMENTS

| | | | |
|---|---|---|---|
| 7,745,325 B2* | 6/2010 | Koh et al. | 438/622 |
| 7,799,641 B2* | 9/2010 | Lee et al. | 438/270 |
| 8,164,138 B2* | 4/2012 | Lee | 257/330 |
| 8,299,517 B2* | 10/2012 | Jang et al. | 257/306 |
| 2007/0004194 A1* | 1/2007 | Cho et al. | 438/624 |

* cited by examiner

*Primary Examiner* — Calvin Lee
(74) *Attorney, Agent, or Firm* — Innovation Counsel LLP

(57) ABSTRACT

A method for manufacturing a semiconductor device includes providing a substrate having a first surface and a second surface, the second surface is on the opposite side of the substrate facing away from the first surface. The method further includes forming a first portion of an opening by etching a portion of the substrate from the first surface, forming a buffer layer on an inner surface of the first portion, etching a bottom of the buffer layer to expose an area of the underlying substrate, and etching the exposed area of the substrate to form a second portion of the opening. The method also includes performing an isotropic etching on the second portion of the opening to obtain a flask-shaped opening and filling the opening with a filling material. The method also includes partially removing a portion of the second surface and the filling material from the second portion of the opening.

15 Claims, 6 Drawing Sheets

SEMICONDUCTOR DEVICE AND MANUFACTURING METHOD THEREFOR

CROSS-REFERENCES TO RELATED APPLICATIONS

This application claims priority to Chinese Patent Application No. 201110174754.5, filed on Jun. 27, 2011 and entitled "Semiconductor Device and Manufacturing Method Therefor", which is incorporated herein by reference in its entirety.

BACKGROUND OF THE INVENTION

1. Field of the Invention

The present invention relates to a semiconductor device and a method for manufacturing a semiconductor device. More specifically, the present disclosure relates to a semiconductor device having a through hole as well as to a manufacturing method therefor.

2. Description of the Related Art

Technology for forming a through hole in a substrate containing a semiconductor material such as silicon has been developed. For example, a through semiconductor via (TSV) technology is known. In the through semiconductor via technology, a though hole is formed in a semiconductor substrate and then can be filled with a conductive material to form a conductive material via. The through semiconductor via technology can, for example, bond different chips together by means of the conductive material via.

The through semiconductor via technology has become a new trend in the field of integrated circuit (IC) industry because it enables chips of different functions to be bonded together and thereby reduces the IC chip area as well as the package size.

BRIEF SUMMARY OF THE INVENTION

Conventionally, a through hole filled with a conductive material such as a metallic material (conductive material via) is formed prior to the formation of functional device(s). When filling the through hole with the conductive material, contamination to the filled conductive material may occur (for example, impurities are mixed therewith), and the contaminated filled conductive material cannot endure high temperature during the subsequent process of forming the functional device(s), which thereby brings about defects to the formed conductive material via.

In view of this, a technology is proposed, in which, after the formation of the through hole, the though hole is firstly filled with a filling material to form a "dummy via". According to this technology, the formed through hole is firstly filled with the filling material, and then the filling material is removed after the formation of the functional device(s), and the through hole from which the filling material has been removed is filled with a conductive material, thereby forming a conductive material via.

Figure 1A:
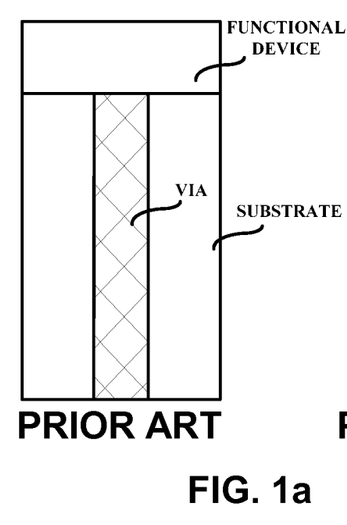
FIGS. 1a and 1b are cross-sectional views schematically showing a through semiconductor via, as known in the prior art.
Figure 1B:
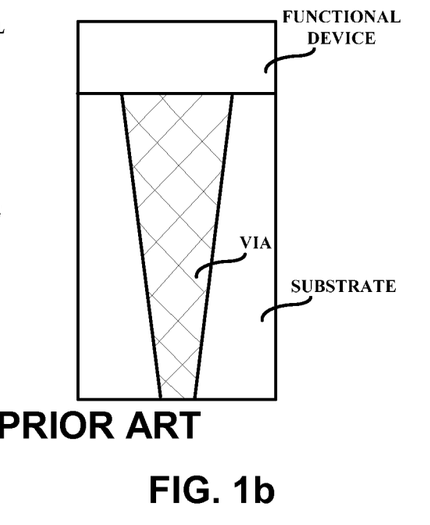

However, in a case of filling, with the conductive material, the through hole from which the filling material has been removed after the formation of the functional device(s), the conductive material has to be filled from the opposite side of the substrate opposite to the side where a functional device(s) is formed. On the other hand, the vertical section of the through hole formed in the substrate is generally of a rectangular shape or a shape that becomes narrower from the side of the substrate where the functional device(s) is formed towards the opposite side, as shown in FIGS. 1a and 1b.

The inventor of the present invention has found that the aforementioned prior art has the following technical problems. According to the through hole as well as the method for forming the through hole discussed above in the prior art, when the conductive material via is to be formed, it is difficult to fill the through hole with the conductive material from the aforementioned other side (i.e., the side on which the opening of the through hole is relatively smaller) of the substrate.

Thus, a new technology is needed to address the above technical problems of the prior art.

Embodiments of the present invention provide a semiconductor device that includes a substrate with a first surface on which a function device is to be formed and a second surface that is opposite to the first surface; a through hole that penetrates through the first surface and the second surface of the substrate, and the through hole has an opening at the second surface that is larger than an opening at the first surface.

According to one embodiment, the through hole can be filled with a conductive material.

Embodiments of the present invention also provide a method for manufacturing a semiconductor device. The method includes providing a substrate having a first surface and a second surface that is opposite of the first surface, etching a portion of the substrate from the first surface of the substrate to form a first portion of an opening, forming a buffer layer on an inner surface of the first portion of the opening; and etching the bottom of the buffer layer to expose an area of the underlying substrate. The method further includes etching the exposed area of the substrate to form a second portion of the opening and conducting an isotropic etching on the second portion of the opening.

In one embodiment, the method can further comprise filling the opening with a filling material.

In one embodiment, the method can further comprise: before filling the opening with a filling material, forming an oxide on an etching interface that is generated by the isotropic etching.

In one embodiment, an area of at least one opening section of the second portion that has been subjected to the isotropic etching and parallel to the substrate surfaces can be larger than an area of an opening section of the first portion at the substrate first surface.

In one embodiment, the method can further comprise partially removing a portion of the second surface of the substrate and the filling material from the second surface of the substrate to expose the filling material filling the second portion that has been subjected to the isotropic etching.

In one embodiment, the method can further comprise removing the filled filling material from the second surface of the substrate, thereby forming a through hole in the substrate that penetrates through the substrate, wherein the through hole has an opening at the second surface that is larger than an opening at the first surface.

In one embodiment, the method can further comprise, before removing the filled filling material, forming a functional device on the first surface of the substrate.

According to one embodiment, the method can further comprise filling the through hole with a conductive material from the second surface of the substrate.

According to one embodiment, the method can further comprise planarizing a surface of the filled conductive material to be flush (coplanar) with the second surface of the substrate.

According to embodiments of the present invention, since the through hole has a relatively larger opening at a side of the substrate that is used for filling a conductive material (i.e., the aforementioned second surface that is opposite to the first surface where the functional device is to be formed), when filling a conductive material such as metal, the conductive material can easily be filled in the formed through hole.

In addition, inventors of the present invention have found that, since the conductive material can be filled in the through hole from a relatively larger opening, defects (e.g., voids) caused during the time of filling can be reduced, and the conductive material can be prevented from being unevenly and insufficiently filled.

Thus, the conductive material via formed after filling the conductive material can have a better conductive property, thereby improving the electro-migration and stress migration performance of connections.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

The present invention is illustrated by way of examples but not in a limiting manner. With reference to the drawings, the present invention can be more clearly understood based on the following detailed descriptions, wherein.

DETAILED DESCRIPTION OF THE INVENTION

Various exemplary embodiments of the present disclosure will now be described in detail with reference to the drawings. It should be noted that the relative arrangement of the components and steps, the numerical expressions, and numerical values set forth in these embodiments do not limit the scope of the present invention unless it is expressively stated otherwise.

In the following descriptions, for the purpose of explanation, particular details are set forth to provide a thorough description of the present invention. However, the present invention can be implemented without one or more of these particular details. In order not to obscure the essence of the present invention, well-known structures and devices in the art are not described herein.

It should be understood that various components shown in the figures are not necessarily drawn to scale.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be incorporated as part of the specification where appropriate.

In all of the examples illustrated and discussed herein, any specific values should be interpreted to be illustrative only and non-limiting. Thus, other examples of the exemplary embodiments could have different values.

It is to be noted that similar reference numerals and letters refer to similar items in the drawings, and thus once an item is defined in one figure, it need not be further described in the following figures.

In the present disclosure, the term "through hole" means a hollow structure penetrating through a semiconductor substrate that has two opposing surfaces and having two end openings at each side of the semiconductor surfaces. The through hole may be a hollow structure in a substrate that can be filled with various filling materials that are conductive or non-conductive. The hollow structure can be cylindrical, square, or other shapes.

In the present disclosure, the term "through semiconductor via" (abbreviated as "TSV") means a structure penetrating through a semiconductor, and this structure can comprise a conductive material. Dummy via means a structure penetrating through a semiconductor, and this structure can include a filling material other than a conductive material. According to the embodiments of the present disclosure, the through semiconductor via can be formed by filling the through hole in the semiconductor substrate with a conductive material. The dummy via can be formed by filling the through hole in the semiconductor with a filling material that is non-conductive. In this disclosure, a "through semiconductor via" sometimes can be referred to as a "via" or a "conductive material via".

In the present disclosure, the term "opening" means an opening of the through hole, but can also mean an opening of the through semiconductor via. That is, the term "opening" means a portion on a surface of a substrate that exposes the hollow structure or that exposes the filled filling material or conductive material.

In the present disclosure, the term "substrate surface" or "a surface of a substrate" means a substrate surface on which a functional device is to be formed (e.g. a first surface S1 described later) or a substrate surface opposite to that surface (e.g. a second surface S2 described later). Examples of the functional device can include, for example, a planar gate or a copper conductive line or a combination thereof. In addition, examples of the functional device can further include a tri-gate, a fin field effect transistor (fin FET) or other silicon-on-insulator (SOI) devices.

First Embodiment

A semiconductor device according to a first embodiment of the present disclosure will now be described.

Figure 2:
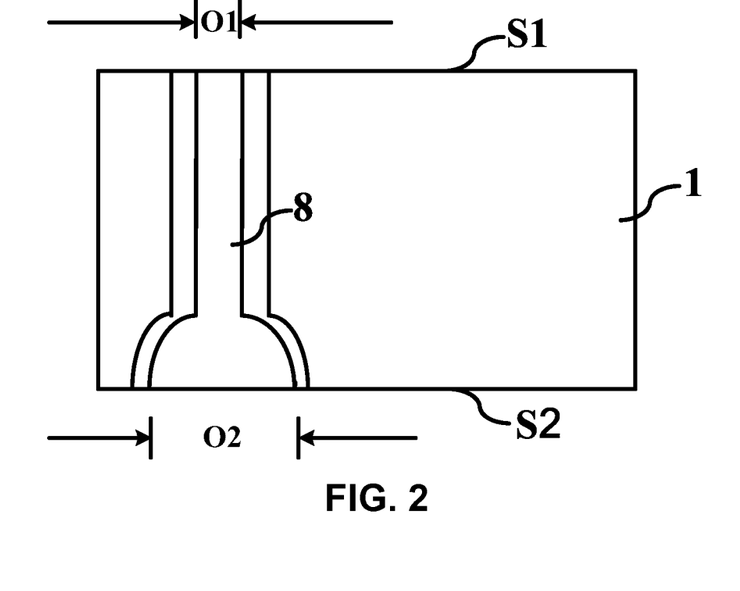
FIG. 2 is a cross-sectional view schematically showing a semiconductor device according to a first embodiment of the present disclosure.

FIG. 2 is a schematic cross-sectional view schematically showing a semiconductor device according to a first embodiment of the present disclosure. As shown in FIG. 2, the semiconductor device comprises a substrate 1 that has a first surface S1 on which a functional device is to be formed and a second surface S2 opposite to the first surface S1. For example, the substrate 1 can be a silicon substrate, a silicon-germanium substrate, a carbon-silicon substrate or a glass substrate or the like. One of ordinary skill in the relevant art can also select a suitable substrate material according to actual needs. The substrate 1 has a though hole 8 that penetrates through the first surface S1 and the second surface S2 of the substrate 1.

As shown in FIG. 2, the through hole 8 has an opening O2 at the second surface S2 larger than an opening O1 of the through hole 8 at the first surface S1 (at the side where the functional device is formed).

In an example embodiment, an area of a section of the through hole 8 at the second surface S2 can be larger than an area of a section of the through hole 8 at the first surface S1. According to another instance of this embodiment, a width of a section of the through hole 8 at the second surface S2 in a predetermined direction is larger than a width of a section of the through hole 8 at the first surface S1 in the predetermined direction. The predetermined direction can be for example a direction of a line connecting a source and a drain in a case where a MOS transistor device is to be formed. In one example, a section of the through hole 8 that is perpendicular to the substrate surface can have a shape such that a width of this shape becomes broader in a direction from the first surface S1 (having the functional device) of the substrate 1 towards the second surface S2 of the substrate 1.

In one embodiment, since the through hole 8 has a relatively larger opening O2 at the side used for filling conductive material (an opposite side to the functional device side), conductive material can be more easily filled in the larger opening O2 as compared to the structures shown in FIGS. 1a and 1b. Thus, defects (e.g. voids) caused when filling the through hole 8 of this embodiment with a conductive material can be reduced, and the conductive material can be prevented from being unevenly and insufficiently filled.

In one exemplary embodiment, the through hole 8 shown in FIG. 2 can be temporarily filled with filling materials such as poly-silicon, for forming a dummy via. The through hole 8 can also be filled with conductive materials such as metal to form a through semiconductor via (conductive material via).

Second Embodiment

A method for manufacturing a semiconductor device according to a second embodiment of the present disclosure will now be described.

Figure 3A:
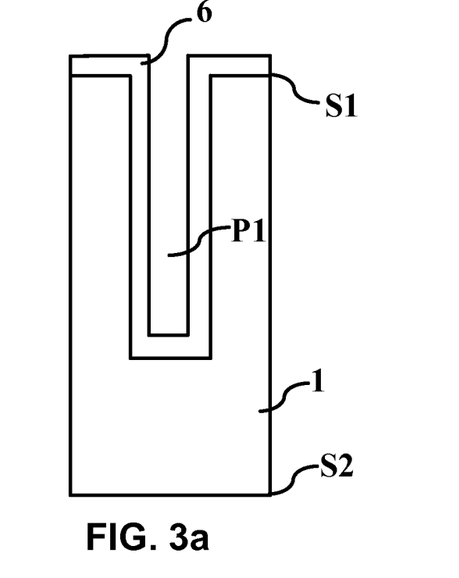
FIGS. 3a to 3c are cross-sectional views schematically showing a process flow for manufacturing a semiconductor device according to a second embodiment of the present disclosure.
Figure 3B:
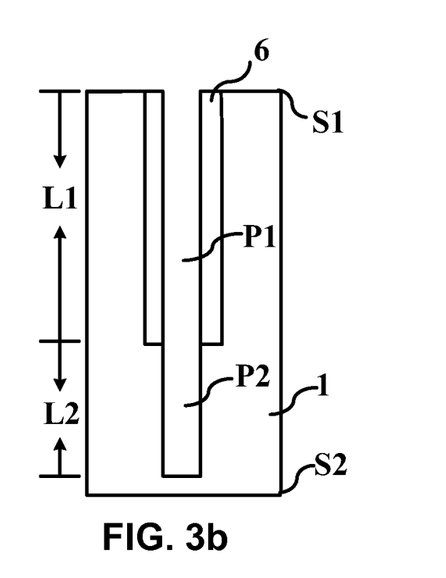
Figure 3C:
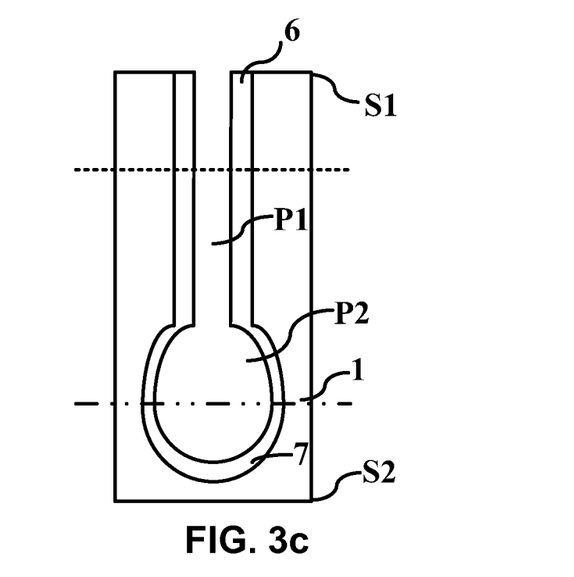

The method for manufacturing a semiconductor device of this embodiment includes process described herein with reference to FIGS. 3a~3c. According to one embodiment, a semiconductor device includes a substrate 1 having an opening structure as shown in FIG. 3c, wherein the opening structure comprises a first portion P1 and a second portion P2.

As shown in FIG. 3a, the substrate 1 is etched from a first side S1 of the substrate 1 (the first surface S1 side) to form the first portion P1 of the opening. The etching used for forming the first portion P1 can be an anisotropic etching, for example, a dry anisotropic etching. Then, a buffer layer 6 is formed on an inner surface of the first portion P1 of the opening. The buffer layer 6 can be, for example, a silicon oxide layer formed by thermal oxidation, or a silicon nitride (e.g. SiN), silicon oxide (e.g. $SiO_2$), or silicon oxynitride (e.g. SiON) formed by deposition (e.g. chemical vapour deposition).

Then, as shown in FIG. 3b, the bottom of the buffer layer 6 is etched to expose the underlying substrate 1, and then the exposed substrate 1 is etched to form a recess as the second portion P2 of the opening. That is, the first portion P1 of the opening is a portion having sidewalls covered with the buffer layer 6, and the second portion P2 is a portion having sidewalls that are not covered with the buffer layer 6.

In an embodiment, a ratio of a length (L2) of the second portion P2 in a depth direction of the opening to a whole depth (L1+L2) of the opening can be within a range from 0.1 to 0.4.

Then, as shown in FIG. 3c, an isotropic etching is conducted on the second portion P2 of the hole. The isotropic etching can be, for example, a wet isotropic etching or a dry isotropic etching.

Since an isotropic etching is conducted on the second portion P2 of the hole, an area of at least one opening section (indicated by the double-dots-line in FIG. 3c) of the second portion P2 that has been subjected to the isotropic etching and in parallel with the substrate surface is larger than an area of a hole section (indicated by dashed line in FIG. 3c) of the first portion P1 and in parallel with the substrate surface. More specifically, an area of at least one opening section of the second portion P2 that has been subjected to the isotropic etching and in parallel with the substrate surface is larger than an area of a hole section of the first portion P1 at the first surface 51 and in parallel with the substrate surface.

According to one instance of this embodiment, in the process shown in FIG. 3c, a hole having a section of a shape like a "flask" is formed.

For example, the first portion P1 can be approximately a column or a cone whose centre axis is perpendicular to the substrate surface. In addition, the second portion P2 that has been subjected to the isotropic etching can be approximately a sphere whose diameter is larger than the width (or the average width or the median width) of the first portion P1. As an alternative solution, the second portion P2 can also be approximately a spheroidicity, wherein at least one of the long focus length and the short focus length of the spheroidicity is larger than the width (or the average width or the median width) of the first portion P1.

Although examples of several possible shapes of the opening (including the first portion P1 and the second portion P2) exemplified in FIG. 3c have been given, the shape of the opening (including the first portion P1 and the second portion P2) is not limited to the above particular examples. It is sufficient if an area of at least one opening section of the second portion P2 that has been subjected to the isotropic etching and in parallel with the substrate surface is larger than an area of a hole section of the first portion P1 and in parallel with the substrate surface.

The substrate having an opening manufactured according the present embodiment can subsequently be used for manufacturing a through hole that has a relatively larger opening at a side of the substrate that is opposite to the functional device side. As such, defects (e.g. voids) caused when filling conductive material in the through hole manufactured in such a way can be reduced, and then the conductive material can be prevented from being unevenly and insufficiently filled.

Third Embodiment

A method for manufacturing a semiconductor device according to a third embodiment of the present disclosure will now be described with reference to FIGS. 4a~4j.

FIGS. 4a~4j are cross-sectional views schematically showing a process flow of manufacturing a semiconductor device according an embodiment of the present invention. Some or all of these manufacturing processes can be used for manufacturing the semiconductor device shown in FIG. 2. Materials, configurations, sizes and the like for the components described in the first and second embodiments are likewise applicable to the present embodiment but should not be construed as limiting this embodiment.

Figure 4A:
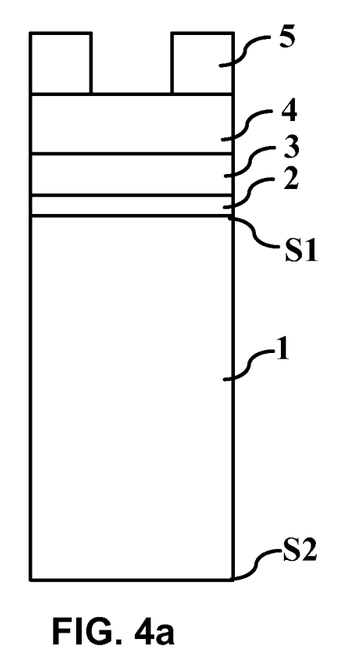
FIGS. 4a to 4j are cross-sectional views schematically showing a process flow for manufacturing a semiconductor device according to a third embodiment of the present disclosure.
Figure 4B:
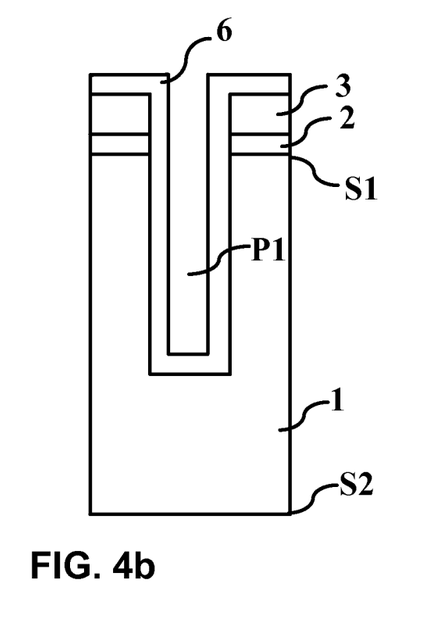

As shown in FIG. 4b, the substrate 1 is etched from one side (the first surface S1 side) of the substrate 1 to form a first portion P1 of an opening. The etching for forming the first portion P1 of the hole can be an anisotropic etching, for example, a dry anisotropic etching. For example, the etching used for forming the first portion P1 can be an anisotropic etching using $CF_4$ as an etching gas.

In one example embodiment, as shown in FIG. 4a, before etching the substrate 1, an oxide layer 2, a nitride layer 3, a bottom anti-reflective coating (BARC) layer 4 and a resist layer 5 are subsequently formed on the substrate 1, and then the substrate 1 with the above-mentioned layers formed thereon is etched. However, the processes shown in FIG. 4 are merely exemplary, but not limiting. One of ordinary skill in the relevant art knows various methods for forming openings or recesses by conducting an etching in a substrate, and thus can select appropriate methods to implement the etching to the substrate 1, detailed descriptions of which are omitted herein for the sake of brevity.

After etching the substrate 1 to form the first portion P1 of the opening, a buffer layer 6 is formed on an inner surface of the first portion P1 of the opening. The buffer layer 6 can be, for example, a silicon oxide formed by thermal oxidation, or a silicon nitride, a silicon oxide or silicon oxynitride formed by deposition (e.g. chemical vapour deposition).

Figure 4C:
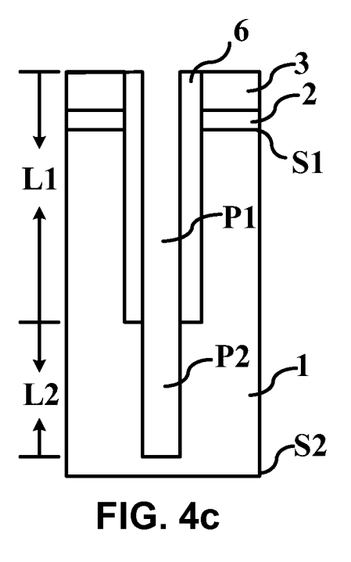

Thereafter, as shown in FIG. 4c, a bottom of the buffer layer 6 is etched to expose the underlying substrate 1. The etching of the bottom of the buffer layer 6 can be an anisotropic etching, for example an anisotropic etching using $CF_4$ as an etching gas. Further, the exposed substrate 1 is also etched to form a second portion P2 of the opening. The etching of the exposed substrate 1 can be an anisotropic etching, for example, an anisotropic etching using $SF_6$ or HBr as an etching gas. As shown in FIG. 4c, with above processes, the first portion P1 is an opening portion having sidewalls covered with the buffer layer 6, and the second portion P2 is an opening portion having sidewalls that are not covered with the buffer layer 6.

According to one implementation of this embodiment, a ratio of a length (L2) of the second portion P2 of the hole in a depth direction of the hole to a whole depth (L1+L2) of the hole can be within a range from 0.1 to 0.4.

Figure 4D:
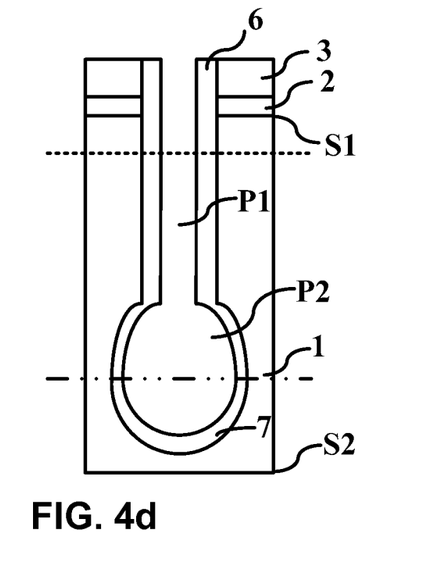

Then, as shown in FIG. 4d, an isotropic etching is conducted on the second portion P2 of the opening. The isotropic etching can be, for example a wet isotropic etching or a dry isotropic etching. The isotropic etching enables the second portion P2 of the opening to be etched in all directions, thereby forming the second portion P2 that has been subjected to the isotropic etching as shown in FIG. 4d.

A resist used for conducting the isotropic etching on the second portion P2 is selected such that, after the isotropic etching, the buffer layer 6 on the sidewall of the first portion P1 of the hole is still retained. An area of at least one opening section (illustrated by a double-dots-line in FIG. 4d) of the second portion P2 that has been subjected to the isotropic etching and in parallel with the substrate surface is larger than an area of an opening section (illustrated by a dashed line in FIG. 4d) of the first portion P1 and in parallel with the substrate surface.

Next, an oxide 7 is formed on an inner wall of the second portion P2 that has been subjected to the isotropic etching. As the oxide 7, for example, a silicon oxide layer can be formed on the inner wall of the second portion P2 that has been subjected to the isotropic etching by thermal oxidation.

Figure 4E:
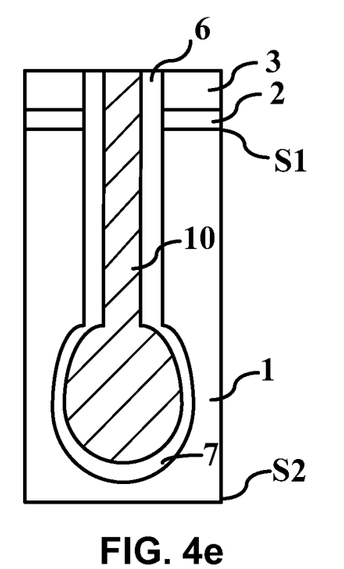

Then, as shown in FIG. 4e, the formed opening can be filled with a filling material 10. For example, the opening can be filled by depositing the filling material 10 into the opening. Here, the filling material 10 can be any material that is easy to be filled and removed, so long as this material is different from the materials of the buffer layer 6 and the oxide 7. For example, the filling material can be a poly-silicon. In addition, in a case where the buffer layer 6 is an oxide, the filling material 10 can be, for example, a nitride.

Figure 4F:
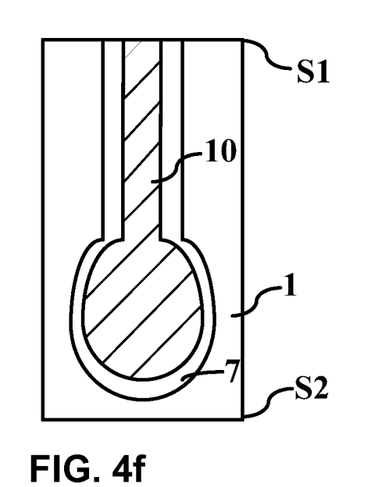

In the case of an implementation according to FIG. 4a, after filling the filling material 10, the oxide 2 and the nitride 3 are removed, as shown in FIG. 4f. The oxide 2 and the nitride 3 can be removed by a chemical mechanical polishing or other suitable methods.

Figure 4G:
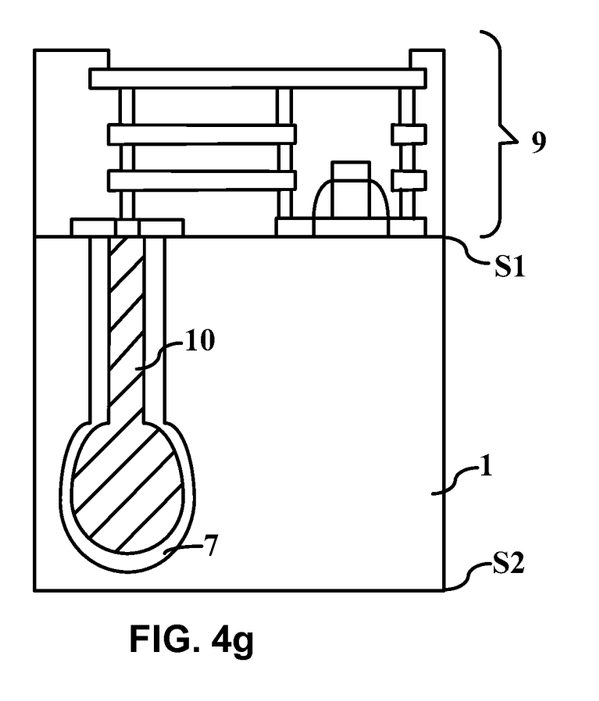

Next, with reference to FIG. 4g, a functional device 9 is formed on the first surface S1 side of the substrate 1.

As described above, examples of the functional device 9 can include, for example, a planar gate or a copper conductive line or a combination thereof. In addition, examples of the function device can also include a tri-gate, a fin field effect transistor (fin FET), or other silicon-on-insulator (SOI) devices.

In an exemplary embodiment shown in FIG. 4g, the functional device can include a gate, a copper conductive line and an electric contact part, and these functional parts can be surrounded by a passivation layer (e.g. an oxide).

The aforementioned various functional devices 9 can be formed by various techniques known in the relevant art, and the details for forming the functional devices 9 are not described herein for the sake of brevity.

Figure 4H:
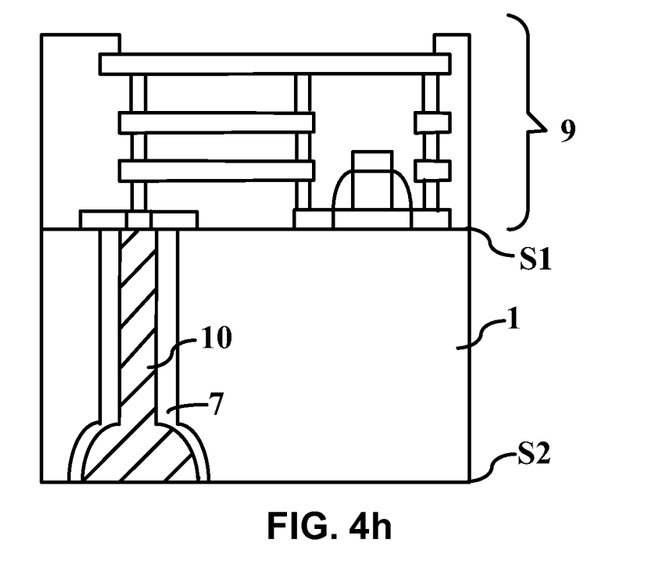

Then, as shown in FIG. 4h, the substrate material and the filling material 10 are partially removed from the second surface S2 side of the substrate 1 that is opposite to the first surface S1 side of the substrate 1 to expose the filling material 10 filled in the second portion P2 that has been subjected to the isotropic etching, thereby forming a "dummy via". The techniques for partially removing the substrate material and the filling material 10 can be, for example, a chemical mechanical polishing, a dry etching or other suitable methods.

According to an embodiment, the removal of the substrate material and the filling material 10 is controlled such that an area of a section of the exposed second portion P2 at the second surface S2 is larger than an area of a hole section at an intersection of the first portion P1 and the second portion P2.

Preferably, the removal of the substrate material and the filling material 10 can be controlled such that only about a half of a length of the second portion P2 that has been subjected to the isotropic etching is retained.

Figure 4I:
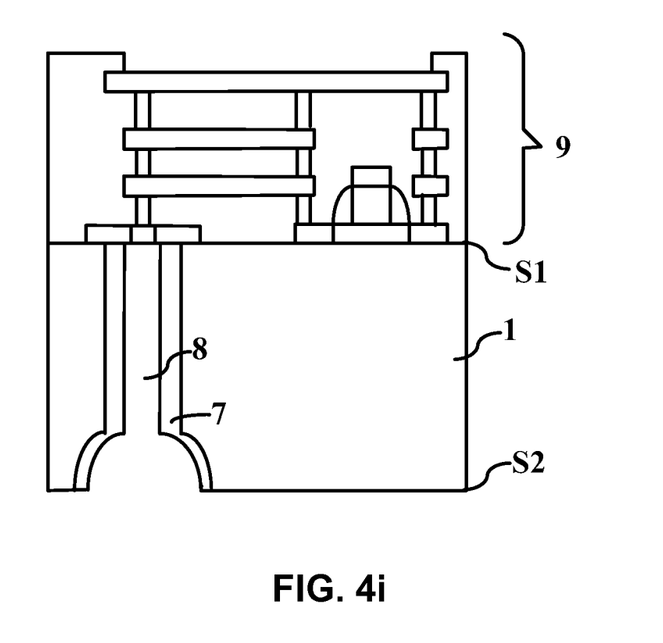

Thereafter, as shown in FIG. 4i, the filled filling material 10 is removed from the second surface S2 side of the substrate 1, thereby a through hole 8 penetrating through the substrate 1 is formed in the substrate 1. The through hole 8 has an opening at the second surface S2 side larger than an opening at the first surface S1 side. The method for removing the filling material 10 can be, for example, a wet etching or other commonly-used suitable etching methods.

Figure 4J:
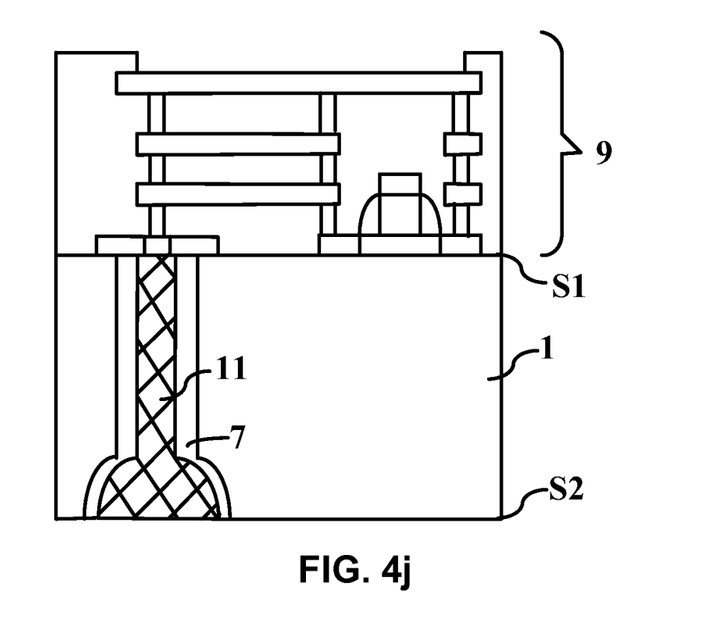

After removing the filling material 10, a conductive material 11 is filled into the through hole 8 from the second surface S2 side of the substrate 1 through the relatively larger opening, as shown in FIG. 4j. The filled conductive material 11 can be, for example, a metal material (e.g., copper, tungsten or aluminum). The conductive material 11 can be filled by a physical vapor deposition method or other suitable methods.

In one embodiment, the conductive material 11 can be filled such that a surface of the conductive material 11 is flush with a surface of the second surface S2 side of the substrate.

Since the fabricated through hole 8 described in embodiments of the present invention has a relatively larger opening at a side of the substrate that is opposite to the functional device 9 side used for filling the conductive material 11, the conductive material 11 can be more easily filled into the formed through hole 8. Thus, defects (e.g., voids) caused when filling the conductive material 11 into the through hole 8 can be reduced, and the conductive material can be prevented from being unevenly and insufficiently filled. Therefore, the conductive material via formed after filling of the conductive material 11 can have a better conductive property, such that the electro-migration and stress migration performances of connections are improved.

Fourth Embodiment

A method for manufacturing a semiconductor device according to a fourth embodiment of the present disclosure will now be described with reference to FIGS. 4e~4f, 5 and 4h. This embodiment differs from the third embodiment in that, the substrate material and the filling material 10 are first partially removed and then the functional device 9 is formed. Only the difference between the fourth embodiment and the third embodiment is described below. Descriptions about process steps that are the same as those of the third embodiment will be omitted, and reference can be made to the descriptions described above in the third embodiment in connection with FIGS. 4a~4d and 4i~4j.

As shown in FIG. 4e, the filling material 10 is filled into the formed opening. For example, the opening can be filled by depositing the filling material 10 in the opening. Here, the filling material 10 can be any material that is easy to be filled and removed, so long as this material is different from the materials of the buffer layer 6 and the oxide 7. For example, the filling material can be a poly-silicon. In addition, when the buffer layer 6 is an oxide, the filling material 10 can be, for example, a nitride.

In the case of an implementation according to FIG. 4a, after filling the filling material 10, the oxide layer 2 and the nitride layer 3 are removed, as shown in FIG. 4f. The oxide layer 2 and the nitride layer 3 can be removed, for example, by a chemical mechanical polishing or other suitable methods.

Figure 5:
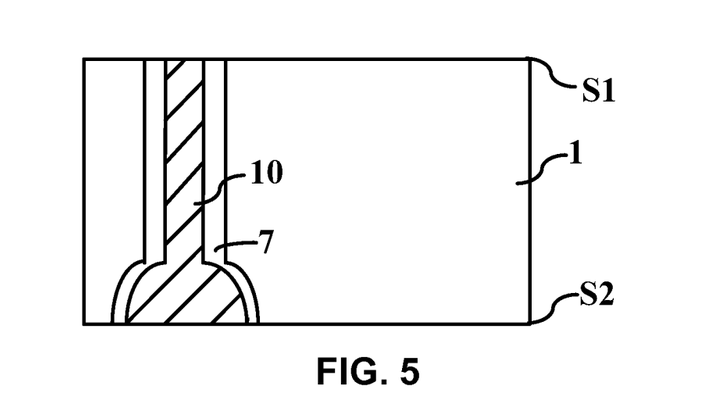
FIG. 5 is a cross-sectional view schematically showing a process flow for manufacturing a semiconductor device according to a fourth embodiment of the present disclosure.

Then, as shown in FIG. 5, the substrate material and the filling material 10 are partially removed from the second surface S2 side of the substrate 1 that is opposite to the first surface S1 side of the substrate 1 to expose the filling material 10 filled in the second portion P2 that has been subjected to the isotropic etching, thereby forming a "dummy via". The techniques for partially removing the substrate material and the filling material 10 can be, for example, a chemical mechanical polishing, a dry etching or other suitable methods.

In one embodiment, the removal of the substrate material and the filling material 10 is controlled such that an area of a section of the exposed second portion P2 at the second surface S2 is larger than an area of an opening section at an intersection of the first portion P1 and the second portion P2.

Preferably, the removal of the substrate material and the filling material 10 can be controlled such that only about a half of a length of the second portion P2 that has been subjected to the isotropic etching is retained.

Next, a functional device 9 is formed on the first surface S1 side of the substrate 1 to form the structure shown in FIG. 4h. As described above, examples of the functional device 9 can include, for example, a planar gate or a copper conductive line or a combination thereof. In addition, examples of the functional device can also include a tri-gate, a fin field effect transistor (fin FET), or other silicon-on-insulator (SOI) device.

In one exemplary embodiment shown in FIG. 4h, the functional device can include a gate, a copper conductive line and an electric contact part, and these functional parts can be surrounded by a passivation layer (e.g. an oxide).

The aforementioned various functional devices 9 can be formed by various techniques known in the relevant art, and the details for forming the function devices 9 are not described herein.

The subsequent processing processes are the same as those described in connection with the third embodiment.

Similarly to the third embodiment, since the through hole 8 fabricated according to the process of the fourth embodiment has a relatively larger opening at the side used for filling the conductive material 11 (a side of the substrate that is opposite to the functional device 9 side), the conductive material 11 can be more easily filled into the formed through hole 8. As such, in this embodiment, defects (e.g. voids) caused when filling the conductive material 11 into the through hole 8 can be reduced, and the conductive material can be prevented from being unevenly and insufficiently filled. Therefore, the conductive material via formed after filling the conductive material 11 can have a better conductive property, such that the electro-migration and stress migration performances of the connections are improved.

So far, the method for manufacturing a semiconductor device and the semiconductor device formed thereby according to the present invention has been described in detail. In order not to obscure the concepts of the present invention, some details known in the relevant art are not described. One of ordinary skill in the relevant art, based on the above descriptions, could definitely understand how to implement the technical solution disclosed herein.

For example, although the structure of a single through silicon via and the manufacturing process thereof has been described above with reference to the accompanying drawings, the above structure and manufacturing process can be applied to a plurality of silicon through holes in a semiconductor device array. In such a case, a plurality of through silicon via can be formed simultaneously on the same substrate by means of the above manufacturing processes.

In addition, although it has not been described above, after removing the oxide 2 and the nitride 3 as shown in FIG. 4f, after partially removing the substrate material and the filling material 10 as shown in FIG. 4h or FIG. 5, and/or after removing the filling material 10 as shown in FIG. 4i and filling the conductive material 11 as shown in FIG. 4j, a surface processing process (e.g. chemical mechanical polishing or cleaning) can be conducted so as to process a surface of a structure as needed.

Although some specific embodiments of the present invention have been demonstrated in detail with examples, it should be understood by one of ordinary skill in the relevant that the above examples are only intended to be illustrative but not to limit the scope of the present invention. It should be understood by one of ordinary skill in the relevant art that the above embodiments can be modified without departing from the scope and spirit of the present invention. The scope of the present invention is defined by the attached claims.

What is claimed is:

1. A method for manufacturing a semiconductor device, the method comprising:
    etching a substrate from a first surface of the substrate to form a first portion of an opening;
    forming a buffer layer on an inner surface of the first portion of the opening;
    etching a bottom of the buffer layer to expose an underlying substrate;
    etching the exposed substrate to form a second portion of the opening;
    filling a filling material into the opening; and
    partially removing a portion of the substrate and the filling material from a second surface of the substrate opposite the first surface to expose the second portion of the opening.

2. The method according to claim 1, further comprising:
before filling a filling material into the opening, forming an oxide on the second portion of the opening.

3. The method according to claim 1, wherein
the second portion of the opening has a diameter larger than a width of the first portion of the opening.

4. The method according to claim 1, further comprising:
removing the filling material to form a through hole that penetrates through the substrate, the through hole has an opening at the second surface larger than an opening at the first surface.

5. The method according to claim 4, further comprises:
removing the conductive material formed outside the through hole from the second surface of the substrate.

6. The method according to claim 4, further comprising:
before removing the filling material, forming a functional device on the first surface of the substrate.

7. The method according to claim 6, further comprising:
forming a conductive material to fill the through hole.

8. The method according to claim 7, further comprises:
planarizing a surface of the filled conductive material to be coplanar with a surface of said second surface of the substrate.

9. The method according to claim 6, further comprising:
forming a conductive material to fill the through hole.

10. The method according to claim 9, further comprises:
removing the conductive material formed outside the through hole from the second surface of the substrate.

11. The method according to claim 1, further comprising:
forming a functional device on the first surface of the substrate.

12. The method according to claim 1, further comprising:
removing the filling material from the opening; and
forming a conductive material to fill the through hole.

13. The method according to claim 12, further comprises:
removing the conductive material formed outside the through hole from the second surface of the substrate.

14. The method according to claim 1, further comprising:
removing the filling material from the opening; and
forming a conductive material to fill the through hole.

15. The method according to claim 14, further comprises:
removing the conductive material formed outside the through hole from the second surface of the substrate.

* * * * *